(12) United States Patent
Spann et al.

(10) Patent No.: US 9,640,461 B1
(45) Date of Patent: *May 2, 2017

(54) BRIDGING DMB STRUCTURE FOR WIRE BONDING IN A POWER SEMICONDUCTOR MODULE

(71) Applicant: IXYS Corporation, Milpitas, CA (US)

(72) Inventors: Thomas Spann, Furth (DE); Ira Balaj-Loos, Weinheim (DE)

(73) Assignee: IXYS Corporation, Milpitas, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 15/224,588

(22) Filed: Jul. 31, 2016

Related U.S. Application Data

(63) Continuation of application No. 14/929,308, filed on Oct. 31, 2015, now Pat. No. 9,443,792.

(51) Int. Cl.
*H01L 23/373* (2006.01)
*H01L 23/00* (2006.01)
*H01L 25/07* (2006.01)

(52) U.S. Cl.
CPC .......... *H01L 23/3735* (2013.01); *H01L 24/48* (2013.01); *H01L 25/072* (2013.01); *H01L 2224/48227* (2013.01); *H01L 2924/1203* (2013.01); *H01L 2924/13055* (2013.01); *H01L 2924/13091* (2013.01)

(58) Field of Classification Search
USPC .......................................... 165/185; 257/707
See application file for complete search history.

(56) References Cited

U.S. PATENT DOCUMENTS

| | | | | |
|---|---|---|---|---|
| 6,084,771 A | * | 7/2000 | Ranchy | H05K 7/20927 165/185 |
| 6,404,065 B1 | | 6/2002 | Choi | H01L 23/3121 257/782 |
| 6,798,060 B2 | | 9/2004 | Strauch | H01L 23/3735 257/705 |
| 6,812,559 B2 | * | 11/2004 | Palm | H01L 23/3735 257/691 |

(Continued)

OTHER PUBLICATIONS

IXYS Datasheet for "Six-Pack SPT+ IGBT" Part MIEB 101W1200EH, IXYS Corporation, May 11, 2011 (8 pages).

*Primary Examiner* — Zandra Smith
*Assistant Examiner* — Lawrence Tynes, Jr.
(74) *Attorney, Agent, or Firm* — Imperium Patent Works; T. Lester Wallace; Darien K. Wallace

(57) ABSTRACT

A power module includes a substrate DMB (Direct Metal Bonded). A novel bridging DMB is surface mounted to the substrate DMB along with power semiconductor device dice. The top metal layer of the bridging DMB has one or more islands to which bonding wires can connect. In one example, an electrical path extends from a module terminal, through a first bonding wire and to a first location on a strip-shaped island, through the island to a second location, and from the second location and through a second bonding wire. The strip-shaped island of the bridging DMB serves as a section of the overall electrical path. Another bonding wire of a separate electrical path passes transversely over the strip-shaped island without any wire crossing any other wire. Use of the bridging DMB promotes bonding wire mechanical strength as well as heat sinking from bonding wires down to the substrate DMB.

20 Claims, 8 Drawing Sheets

CROSS-SECTIONAL VIEW TAKEN ALONG SECTIONAL LINE A-A' OF FIG. 9

(56) References Cited

U.S. PATENT DOCUMENTS

| | | | |
|---|---|---|---|
| 7,005,734 B2 | 2/2006 | Choi et al. | H01L 23/3735 257/686 |
| 8,847,328 B1 | 9/2014 | Laschek-Enders | H01L 27/0647 257/401 |
| 9,443,792 B1* | 9/2016 | Spann | H01L 23/3735 |
| 2009/0095979 A1* | 4/2009 | Saito | H01L 25/18 257/177 |
| 2014/0029234 A1* | 1/2014 | Chauhan | H01L 23/3128 361/820 |
| 2014/0138075 A1* | 5/2014 | Yang | H01L 23/3735 165/185 |
| 2015/0115452 A1* | 4/2015 | Yoon | H01L 24/29 257/762 |

* cited by examiner

POWER SEMICONDUCTOR DEVICE MODULE

CIRCUIT DIAGRAM OF THE POWER
SEMICONDUCTOR DEVICE MODULE

POWER SEMICONDUCTOR DEVICE MODULE
(SIDE VIEW)

POWER SEMICONDUCTOR DEVICE MODULE
(TOP-DOWN VIEW)

IGBT DIE

DIODE DIE

POWER SEMICONDUCTOR DEVICE MODULE

CROSS-SECTIONAL VIEW TAKEN ALONG SECTIONAL LINE A-A' OF FIG. 9

BRIDGING DMB STRUCTURE
(TOP VIEW)

BRIDGING DMB STRUCTURE
(BOTTOM VIEW)

CROSS-SECTIONAL VIEW SHOWING TWO BRIDGING DMB
STRUCTURES DISPOSED ON A SUBSTRATE DMB STRUCTURE WITHIN
A SEMICONDUCTOR DEVICE MODULE

BRIDGING DMB STRUCTURE
(TOP VIEW)

BRIDGING DMB STRUCTURE
(BOTTOM VIEW)

BRIDGING DMB STRUCTURE
(TOP VIEW)

BRIDGING DMB STRUCTURE FOR WIRE BONDING IN A POWER SEMICONDUCTOR MODULE

CROSS REFERENCE TO RELATED APPLICATIONS

This application is a continuation of, and claims priority under 35 U.S.C. §120 from, nonprovisional U.S. patent application Ser. No. 14/929,308 entitled "Bridging DMB Structure for Wire Bonding in a Power Semiconductor Device Module," filed on Oct. 31, 2015, now U.S. Pat. No. 9,443,792, the subject matter of which is incorporated herein by reference.

TECHNICAL FIELD

The described embodiments relate to power semiconductor device modules.

BACKGROUND INFORMATION

A type of power semiconductor device module includes an injection molded plastic housing. The injection molded housing has a frame-shape that extends around a metal baseplate so that the housing and the metal baseplate together form a tray-shaped recess. The metal baseplate forms the bottom of the tray. Disposed on the top of the metal baseplate in the bottom of the tray is a DMB (Direct Metal Bonded) and semiconductor device assembly. The DMB and semiconductor device assembly includes a DMB structure. The DMB structure is a multi-layer structure that includes an insulative but heat-conductive center ceramic substrate layer. A planar bottom direct metal bonded metal layer is bonded to the bottom surface of the ceramic layer, and a planar top direct metal bonded metal layer is bonded to the top surface of the ceramic layer. The top direct metal bonded metal layer is patterned into a plurality of islands of metal. Discrete semiconductor device dice are surface mounted to the various islands on the top the DMB structure in a way consistent with an overall power device circuit to be realized by the module. The various discrete semiconductor device dice and various portions of the DMB structure are interconnected by bonding wires, both to each other, as well as to external connection terminals of the module, such that the overall wire bonded assembly is a desired power device circuit. The assembly within the tray is then covered over with a layer of soft silicone gel or other soft encapsulant. A plastic cap is then fixed over the top of the tray. Such power semiconductor device modules see widespread use in the power semiconductor device industry. Ways of improving such power semiconductor device modules are sought.

SUMMARY

A power semiconductor device module includes a housing that forms a tray. For example, an injection molded housing along with a metal baseplate can form a central shallow tray structure. The top surface of the metal baseplate is the bottom of the tray. Disposed on the top surface of the metal baseplate in the bottom of the tray is a DMB (Direct Metal Bonded) and semiconductor device assembly. Covering this assembly on the bottom of the tray is a layer of an encapsulant, such as a layer of soft silicone gel material. An injection molded plastic cap is fitted over the top of the tray to cover the encapsulant and the DMB and semiconductor device assembly within the module. A ring of upward-extending metal external connection terminals extends around the peripheral edge of the plastic housing.

The DMB and semiconductor device assembly includes a substrate DMB structure. A top metal layer of the substrate DMB structure is patterned into a plurality of islands. Power semiconductor device dice are surface mounted to some of these islands. A novel bridging DMB structure is also surface mounted to the top of the substrate DMB structure. There is no semiconductor device die mounted to this bridging DMB structure, but rather the bridging DMB structure serves as a bridge for wire or ribbon bonding. In one example, a first electrical path extends from an external connection terminal of the module, through a first bonding wire, to a first connection location on a strip-shaped island of the bridging DMB structure, through the strip-shaped island to a second connection location on the bridging DMB structure, and from the second connection location on the bridging DMB structure and through a second bonding wire to a bonding pad on the top of one of the semiconductor device dice. The strip-shaped island serves as a section of the overall first electrical path. A third bonding wire of a second electrical path passes transversely over the strip-shaped island without any of the bonding wires crossing any other bonding wire.

In some examples, a bond wire extends from a first location on a bridging DMB structure to another location on the bridging DMB structure. Such a bridging bonding wire can pass over another island on the top of the bridging DMB structure, or may not pass over any such other island. The bottom layer of metal of a substrate DMB structure can be patterned into multiple islands, such that the bottom metal layer of the bridging DMB structure can be physically bonded to multiple underlying traces of the substrate DMB structure, without the bottom metal of the bridging DMB structure shorting those traces (islands of the substrate DMB structure) together. In one advantageous embodiment, electrical paths passing through and/over the top metal of the bridging DMB structure are relatively low current paths such as gate current paths and auxiliary emitter current paths, whereas other electrical paths passing underneath the bridging DMB structure are relatively high current paths such as emitter current connections and collector current connections. Use of the bridging DMB in power semiconductor device modules allows more current carrying metal to be provided in the substrate DMB structure for the relatively high current paths, increases mechanical strength of bonding wires, helps prevent shorting between bonding wires, and promotes heat sinking from bonding wires down to the substrate DMB structure.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to background examples and some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "upper", "top", "up", "down", "vertically", "horizontally", "laterally", "lower", "under", "below", "beneath" and "bottom" are used herein to describe relative orientations between different parts of the structure being described, and it is to be understood that the overall structure being described can actually be oriented in any way in three-dimensional space.

Figure 1:
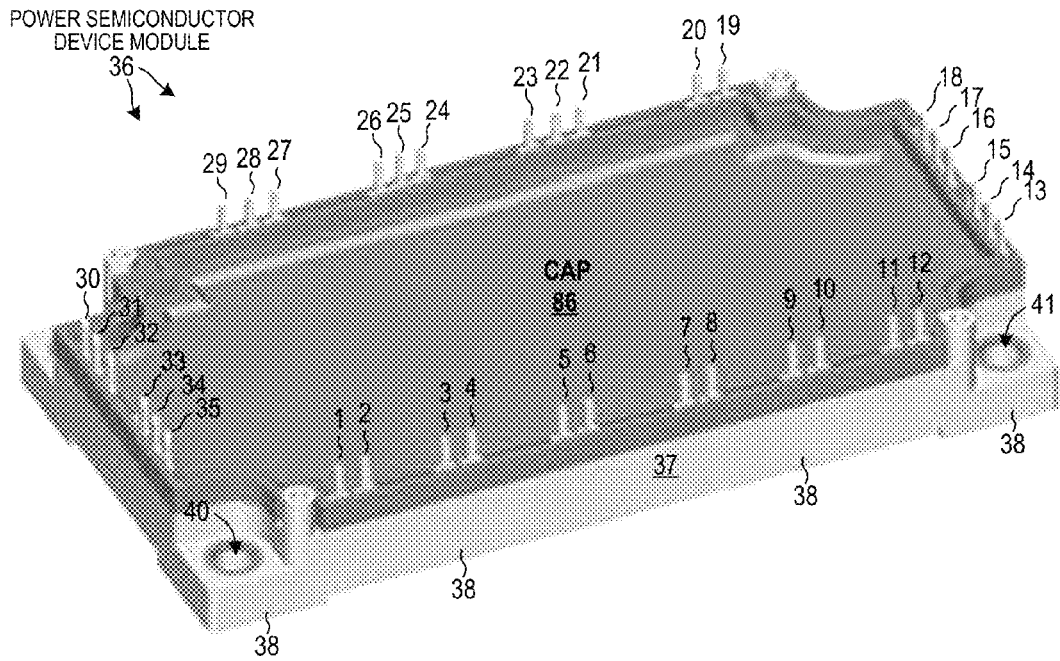
FIG. 1 is a top-down perspective diagram of a power semiconductor device module in accordance with one novel aspect.

FIG. 1 is a top-down perspective diagram of a power semiconductor device module 36 in accordance with one novel aspect. The power semiconductor device module 36 includes an injection molded plastic housing 37 that along with a metal baseplate 38 forms a central shallow tray-shaped recess or depression. The plastic housing 37 extends around and frames the metal baseplate. The metal baseplate 38 forms the bottom of the tray. Solder joined to the top surface of the metal baseplate 38 in the bottom of the tray is a DMB (Direct Metal Bonded) and semiconductor device assembly. Covering this assembly on the bottom of the tray is a layer of an encapsulant, such as a layer of soft silicone gel material 39. A plastic cap 86 is then fitted over the top of the tray to cover the encapsulant and the open face of the tray. A ring of upward-extending metal external connection terminals 1-35 extends around the peripheral edge of the plastic housing 36 as shown in FIG. 1. As is described in further detail below, these metal external connection terminals are electrically coupled to various points of the electrical circuit of the DMB and semiconductor device assembly within the module. The module can be attached to a heatsink via screws (not shown) so that the metal baseplate of the module is pressed against the heatsink to be in good thermal contact with the heatsink. The screws are made to extend through mounting holes 40-43 in the housing 37 so that heads of the screws hold the module against the heatsink. In the particular embodiment illustrated, there are four mounting holes 40-43 for accommodating four such mounting screws. One mounting hole is located at each corner of the housing.

Figure 2:
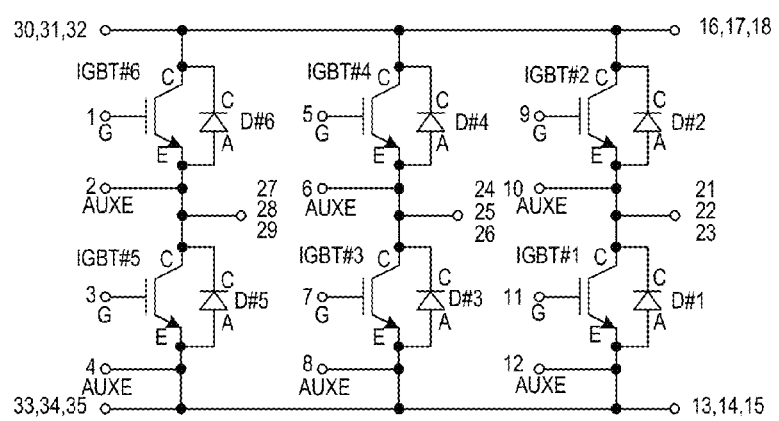
FIG. 2 is a circuit diagram of the circuitry within the power semiconductor device module of FIG. 1.

FIG. 2 is a circuit diagram of the DMB and semiconductor device assembly of the module 36. The reference numerals 1-35 on the diagram of FIG. 2 correspond to the reference numerals 1-35 on FIG. 1. The assembly includes numerous discrete power semiconductor device dice. There are six discrete IGBT (Insulated Gate Bipolar Transistors) dice denoted IGBT#1 through IGBT#6 and there are six discrete diode dice denoted D#1 through D#6. Each discrete IGBT die has a collector terminal and contact (denoted "C"), an emitter terminal and contact (denoted "E"), a gate terminal and contact (denoted "G"), and an auxiliary emitter terminal and contact (denoted "AUXE"). Each discrete diode die has an anode terminal (denoted "A") and a cathode terminal (denoted "C"). The IGBT and diode dice are surface mounted directly to a substrate DMB structure 53 of the assembly.

Figure 3:
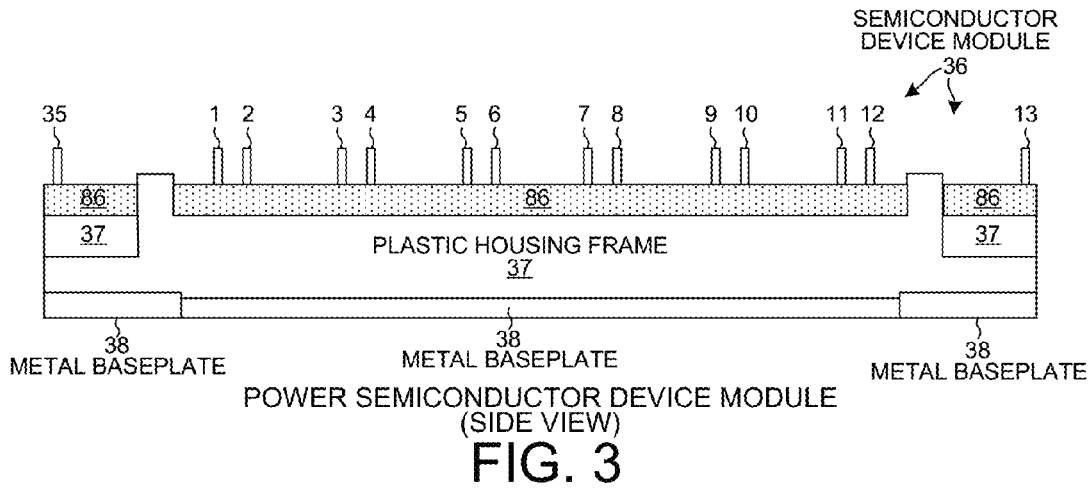
FIG. 3 is a side view diagram of the power semiconductor device module of FIG. 1.

FIG. 3 is a side view diagram of the power semiconductor device module 36 of FIG. 1.

Figure 4:
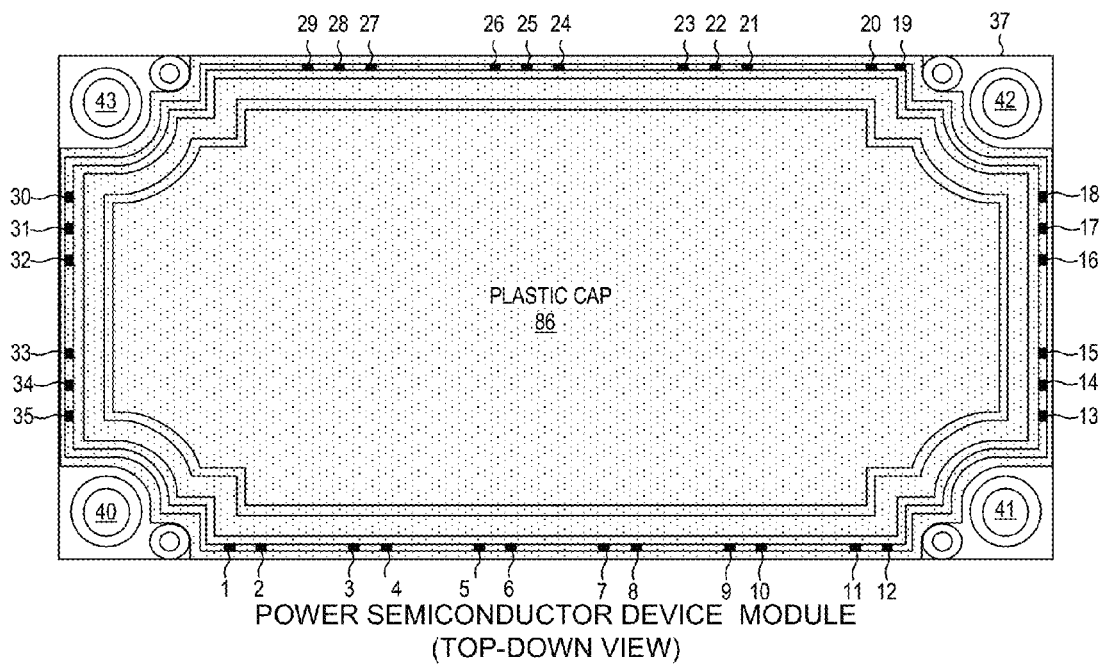
FIG. 4 is a top-down diagram of the power semiconductor device module of FIG. 1.

FIG. 4 is a top-down diagram of the power semiconductor device module 36 of FIG. 1.

Figure 5:
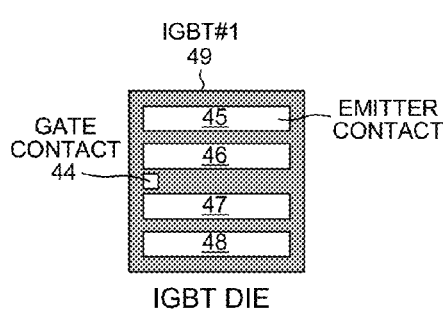
FIG. 5 is a top-down diagram of one of the IGBT dice within the power semiconductor device module of FIG. 1.

FIG. 5 is a top-down diagram of one of the IGBT dice, IGBT#1. All of the six IGBT dice of the DMB and semiconductor device assembly are identical. The IGBT die 49 includes a gate contact 44 and four emitter contracts 45-48 disposed on the top surface of the die 49. The bottom surface of the die (not shown) is a collector contact of the die.

Figure 6:
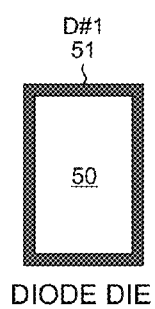
FIG. 6 is a top-down diagram of one of the diode dice within the power semiconductor device module of FIG. 1.

FIG. 6 is a top-down diagram of one of the diode dice, D#1. All of the six diode dice of the DMB and semiconductor device assembly are identical. Die 51 includes an anode contact 50 disposed on the top surface of the die 51, and a cathode contact (now shown) on the bottom of the die. In each pair IGBT/diode pair, the anode of the diode is coupled to the emitter of the IGBT, and the cathode of the diode is coupled to the collector of the IGBT.

Figure 7:
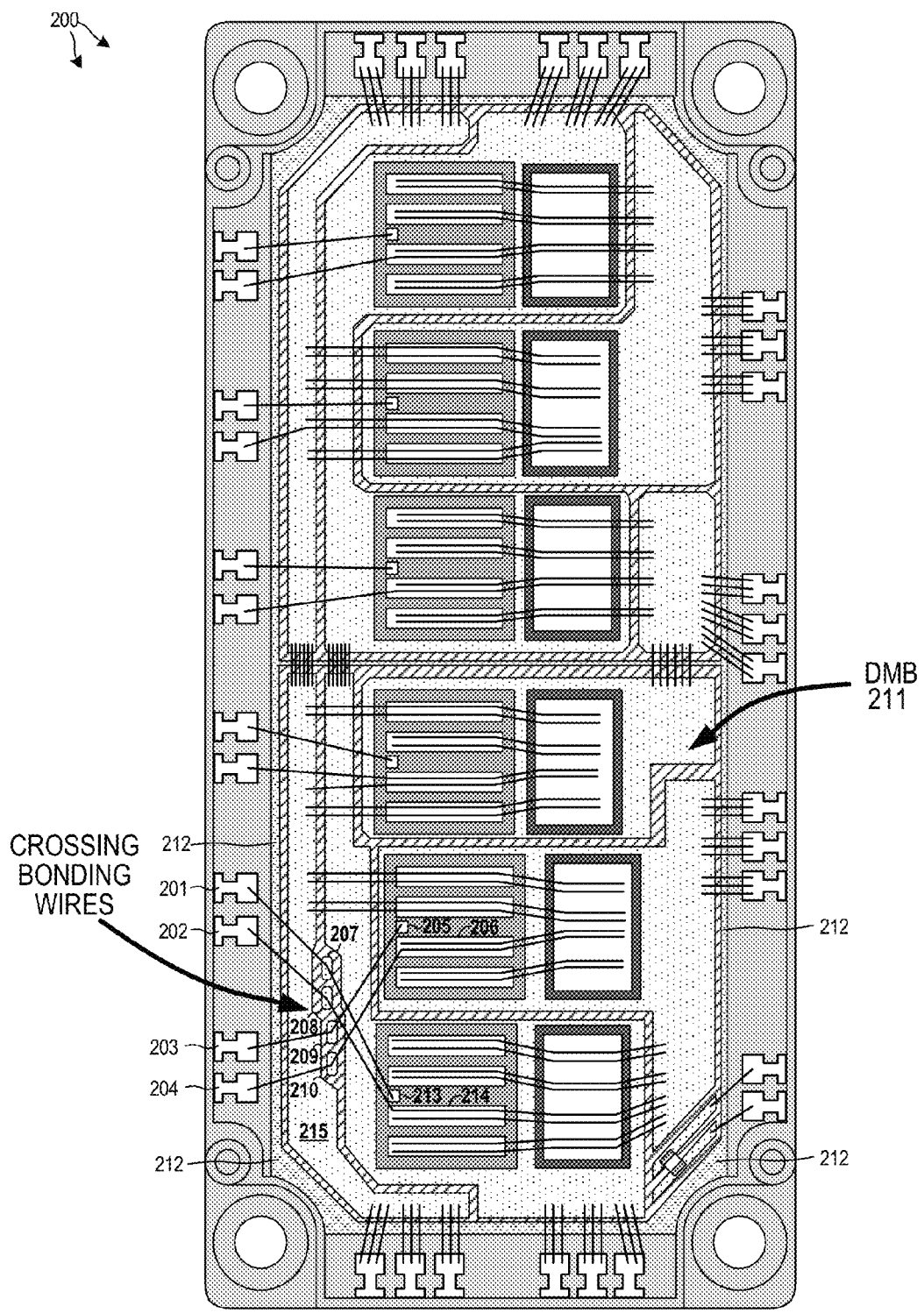
FIG. 7 (Prior Art) is top-down diagram of a prior art power semiconductor device module that has crossing bonding wires.

FIG. 7 is top-down diagram of a prior art semiconductor device module 200 (Prior Art). The cap 86 and the soft silicone gel encapsulant 39 are not shown in the diagram of FIG. 7 so that the top of DMB and semiconductor device assembly can be seen. The module of FIG. 7 has the circuit diagram of FIG. 2 and has the same pinout as illustrated in FIG. 1, FIG. 3 and FIG. 4. The IGBT dice, from top to bottom, in the vertical column orientation shown in FIG. 7, are denoted IGBT#6, IGBT#5, IGBT#4, IGNT#3, IGBT#1 and IGBT#2. The diode dice, from top to bottom, in the vertical column orientation shown in FIG. 7, are denoted D#6, D#5, D#4, D#3, D#1 and D#2. The pinout of the module 200 is determined by external circuitry and/or by customer requirements, yet within the module the IGBT dice are oriented as shown. Consequently, bonding wires from the gate terminal 201 and from the auxiliary emitter terminal 202 to the gate contact 213 and to the emitter contact 214 of IGBT#2 cross with respect to the bonding wires from the gate terminal 203 and from the auxiliary emitter terminal 204 to the gate contact 205 and to the emitter contact 206 of IGBT#1. Advantageously, the length of bonding wires extending between bonding locations is adequately small, and thermal transfer from the bonding wires down to the substrate DMB and down to the metal baseplate beneath it is enhanced, due to the bonding wires being bonded to islands 207-210 of conductive metal of the upper layer of metal of the substrate DMB 211. The islands 207-210 advantageously provide mechanical stability to the bonding wires, and also serve to remove heat from the bonding wires. The IGBT module 200 of FIG. 7 works well in its intended environment. Heat from the bonding wires is successfully conducted from the bonding wires, down through the islands 207-210, to the substrate DMB 211 below, and to the metal baseplate 212 below that. The bonding wires that cross are satisfactorily short as compared to the other bonding wires of the module.

Figure 8:
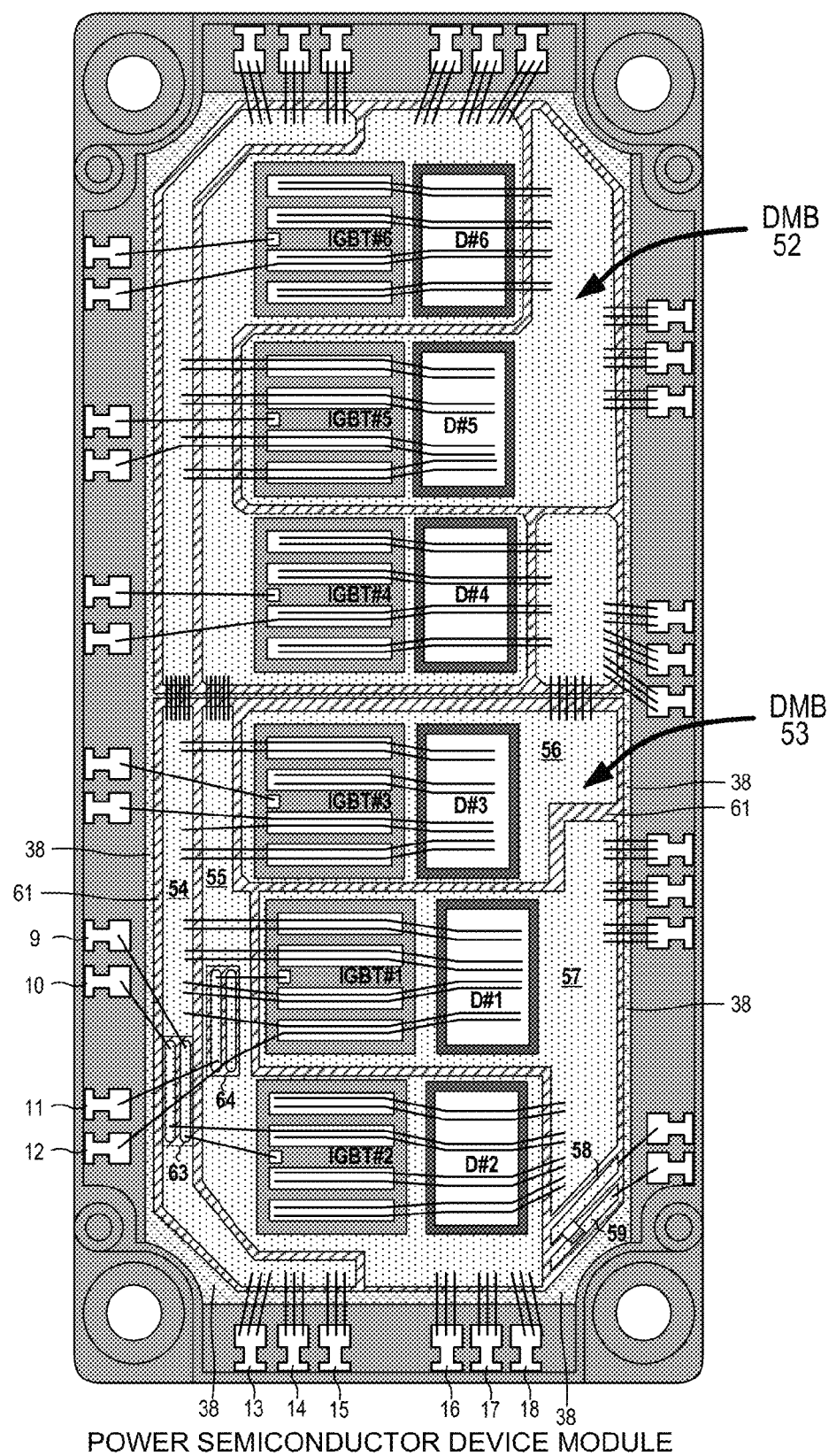
FIG. 8 is a top-down diagram of the novel power semiconductor device module of FIG. 1 that has two novel bridging DMB structures and associated bonding wires.

FIG. 8 is a top-down diagram of the power semiconductor device module 36 of FIG. 1. The cap 86 and the soft silicone gel encapsulant 39 are not shown in the diagram of FIG. 8 so that the top of the DMB and semiconductor device assembly can be seen. The module 36 actually includes two major substrate DMB structures 52 and 53. The upper direct bonded metal layer 60 of substrate DMB structure 53 is patterned into multiple metal islands 54-59. Reference numeral 61 identifies the center ceramic layer of substrate DMB structure 53. The bottom direct bonded metal layer 62 of substrate DMB structure 53 is not shown because it is on the bottom of the DMB in contact with the upper surface of the underlying metal 38. Likewise, the upper direct bonded metal layer of substrate DMB structure 52 is patterned into multiple metal islands. The bottom direct bonded metal layer of substrate DMB structure 52 is not shown because it is on the bottom of the DMB in contact with the upper surface of the underlying metal 38.

The central insulative but thermally conductive ceramic layer of a DMB structure can, for example, be alumina ($Al_2O_3$) or aluminum nitride (AlN). The metal layers of a DMB structure can, for example, be copper or aluminum. In the case of copper metal layers, the DMB structure may be called a DBC ("Direct-Bonded Copper") substrate or a DCB ("Direct Copper Bonded") substrate. In the case of aluminum metal layers, the DMB structure may be called a DBA ("Direct-Bonded Aluminum") substrate or a DAB ("Direct Aluminum Bonded") substrate. For additional details on DMB substrates, see: U.S. Pat. No. 6,404,065, U.S. Pat. No. 6,798,060, and U.S. Pat. No. 7,005,734 (the entire subject matter of each of these three patent documents is incorporated herein by reference).

The DMB and semiconductor device assembly, in addition to the substrate DMB structures 52 and 53, and the IGBT dice, and the diode dice, and heavy aluminum bonding wires, includes two novel bridging DMB structures 63 and 64.

Figure 9:
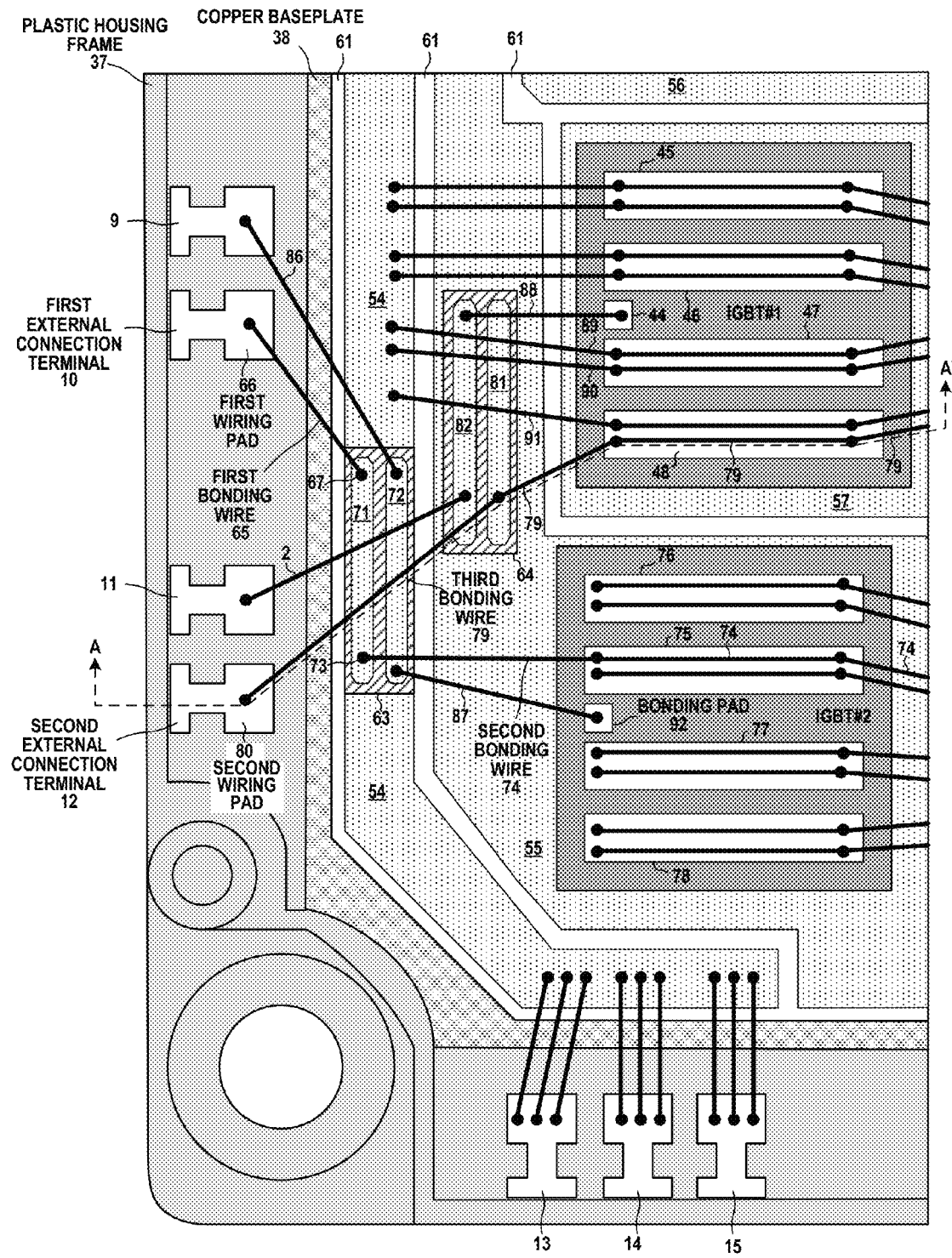
FIG. 9 is a diagram that shows the lower left portion of FIG. 8 in expanded fashion.

FIG. 9 is a diagram that shows the lower left portion of FIG. 8 in expanded fashion. As compared to the module structure of FIG. 7 where there are crossing bonding wires, there are no crossing bonding wires in the novel module structure of FIG. 9. In the example of FIG. 9, each external connection terminal has a vertically extending pin portion and a laterally extending wiring pad portion. The wiring pad portion is sometimes called a "foot". Each external connection terminal is a stamped, formed and bent piece of metal that is press fit down into an accommodating insertion channel in the plastic of the housing so that the terminal is held in place with respect to the housing. (In other examples, the external connection terminals are not inserted (press fit), but rather are transfer molded into the plastic housing.) A first bonding wire 65 extends from the wiring pad 66 of the external connection terminal 10 to a first bonding location 67 on DMB wire bonding bridge structure 63. A first direct bonded metal layer 68 of bridging DMB structure 63 is disposed on the bottom of a ceramic layer 69 of the bridging DMB structure 63. This first direct bonded metal layer 68 is not seen in FIG. 9 because it is disposed underneath ceramic layer 69, and is disposed on and attached to metal island 54 of DMB structure 53. Island 54, which is an elongated conductive strip-shaped structure, is a metal trace and serves to conduct large currents from the emitters of IGBT#5, IGBT#3 and IGBT#1 to the external connection terminals 13, 14 and 15. This current flows through the elongated trace of metal under the bridging DMB structure 63. A second direct bonded metal layer 70 of the bridging DMB structure 63 is disposed on the top of the ceramic layer 69 of the bridging DMB structure 63. This second direct bonded metal layer is patterned into two elongated parallel-extending strip-shaped islands 71 and 72. The bonding location 67 is toward the upper end of island 71. A second bonding location 73 is toward the bottom end of the island 71. A second bonding wire 74 extends from the second bonding location 73 to the emitter contact 75 of IGBT#2. Reference numerals 75-78 identify emitter contacts on the upper surface of IGBT#2. A third bonding wire 79 extends from the wiring pad 80 of external connection terminal 12, up and over and across the bridging DMB structure 63, and to an strip-shaped island 81 of the upper direct bonded metal layer 83 of bridging DMB structure 64. The first and second bridging DMB structures 63 and 64 are of identical construction in this embodiment. Reference numerals 81 and 82 identify elongated strip-shaped islands of the upper direct bonded metal layer 83 of the bridging DMB structure 64. A bottom direct bonded metal layer 84 of the bridging DMB structure 64 is not shown in the diagram because it is disposed underneath the ceramic layer 85 of the bridging DMB structure 64. The third bonding wire 79 does not contact any part of bridging DMB structure 63. The third bonding wire 79 passes over bridging DMB structure 63 at a crossing location between the first bonding location 67 and the second bonding location 73. In FIG. 9, reference numerals 86-91 identify some of the other bonding wires of the assembly. In the illustration, a dot at a point on a bonding wire represents a bonding location. Reference numeral 92 represents a gate contact. Of importance, the width of island trace 54, where the island trace passes under the bridging DMB structure 63, is not narrowed due to having to provide bonding islands 207-210 as in the case of FIG. 7. The cross-section of metal of the island trace 54 of FIG. 9 is larger as compared the cross-section of metal in the island trace 215 of FIG. 7. Moreover, there is also conductive metal provided in the first (bottom) direct bonded metal layer 68 of bridging DMB structure 63. There is also an amount of conductive solder 93 used to join the bottom of DMB 63 to the top of island trace 54. As compared to a simple point-bonding contact located approximately midway along the length of a bonding wire as in the case of FIG. 7, there is better thermal transfer between the bonding wire connections of FIG. 9 and the underlying metal 38 due to the large contact metal contact area on the bottom of the bridging DMB structure 63. This large metal contact area forms a superior thermal contact to the underlying heat sinking structures.

In addition to the advantage of allowing the current carrying cross-sectional area of metal traces passing underneath the bridging DMB structures to be maximized, use of the bridging DMB structures also allows the maximum length of the bonding wires to be shortened as compared to the prior art structure of FIG. 7. In the case of using the novel bridging DMB structures, some of the distance of a connection (for example, the connection between terminal 10 and emitter contact 75) may be provided by a part of a strip-shaped island on the top of a DMB structure. As a result, the longest section of bonding wire of the overall connection can be made shorter than in the prior art structure of FIG. 7. Shortening bonding wires serves to increase the mechanical strength of the bonding wires and to reduce their susceptibility to breakage, especially at their bonding locations. Providing a section of the overall connection in the form of an island on the top of a bridging DMB structure also allows there to be more cross-sectional area of current carrying metal in the DMB section of the overall connection as compared to a prior art situation where all current was conducted through bonding wires. If even more current carrying metal is desired, then a bonding wire can be made to extend in parallel across the top of a strip-shaped island, with the parallel-extending bond wire being connected down to the strip-shaped island at various points along its length, thereby effectively increasing the amount of current carrying metal even more.

The bridging DMB structures in this embodiment are small structures used for bridge wiring, and particularly for bridge wiring in the narrow space between the vertical column of IGBT device of FIG. 8 and the left edges of the module of FIG. 8. There is no semiconductor device mounted to the top of either of the two bridging DMB structures. Each of the discrete semiconductor IGBT and diode devices of FIG. 8 has a major top surface area. The bridging DMB structures of FIG. 8 also have a major top surface area. The major top surface area of each of the discrete semiconductor devices is larger than the major top surface area of each of the bridging DMB structures. This small size of the bridging DMB structures facilitates use of the same bridging DMB structure at various locations around the discrete semiconductor device, without introducing a need either to change the patterning of a substrate DMB structure or to change the mounting locations of the various semiconductor devices within the module.

Figure 10:
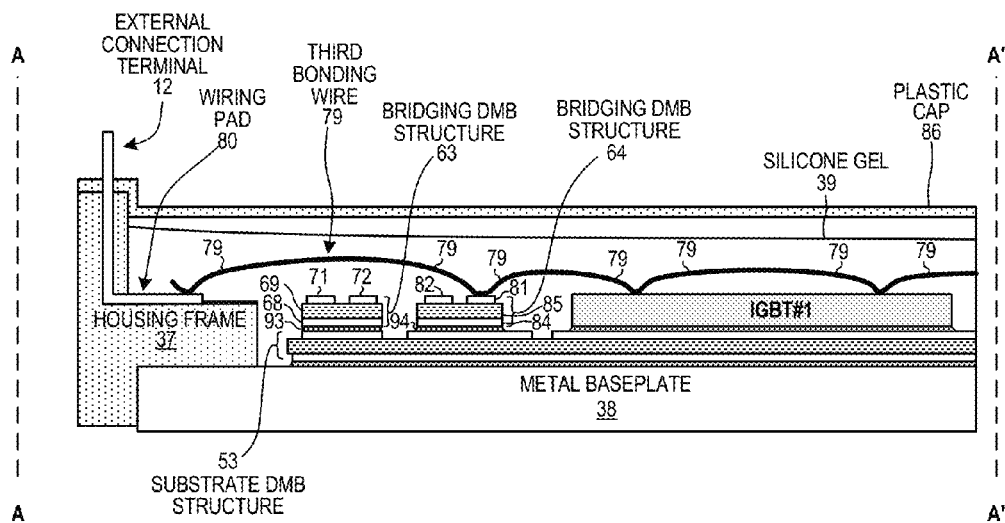
FIG. 10 is a cross-sectional diagram taken along sectional line A-A' of FIG. 9.

FIG. 10 is a simplified cross-sectional diagram taken along sectional line A-A' of FIG. 9. The bridging DMB structure 63 includes the bottom direct bonded metal layer 68, the central ceramic layer 69, and the parallel-extending strip-shaped islands 71 and 72 of the upper direct bonded metal layer 70. The bridging DMB structure 64 includes the bottom direct bonded metal layer 84, the central ceramic layer 85, and the parallel-extending strip-shaped islands 82 and 81 of the upper direct bonded metal layer. The bridging DMB structure 63 is joined to DMB structure 53 by solder 93. The bridging DMB structure 64 is joined to DMB structure 53 by solder 94.

Figure 11:
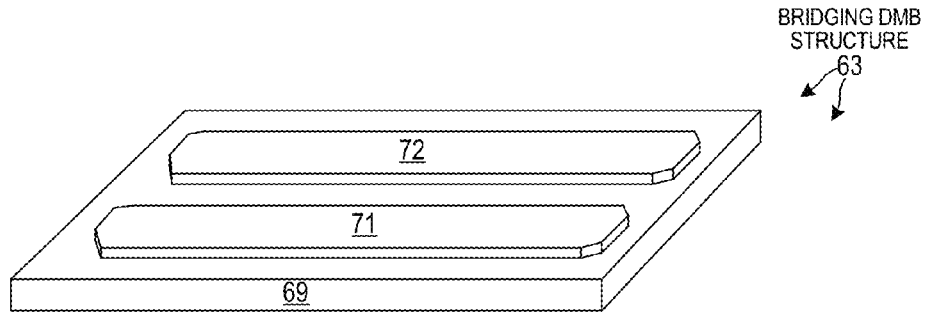
FIG. 11 is a perspective diagram of the top of a novel bridging DMB structure.

FIG. 11 is a perspective diagram of the top of the bridging DMB structure 63.

Figure 12:
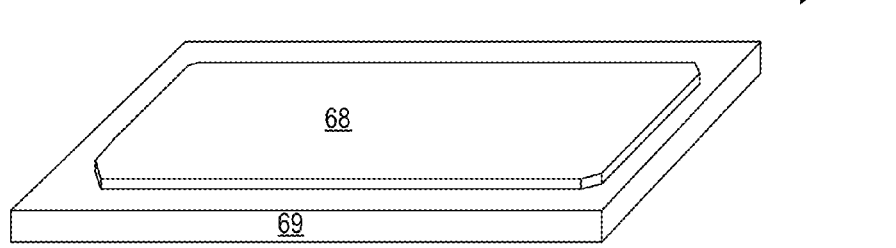
FIG. 12 is a perspective diagram of the bottom of the novel bridging DMB structure of FIG. 11.

FIG. 12 is a perspective diagram of the bottom of the bridging DMB structure 63.

Figure 13:
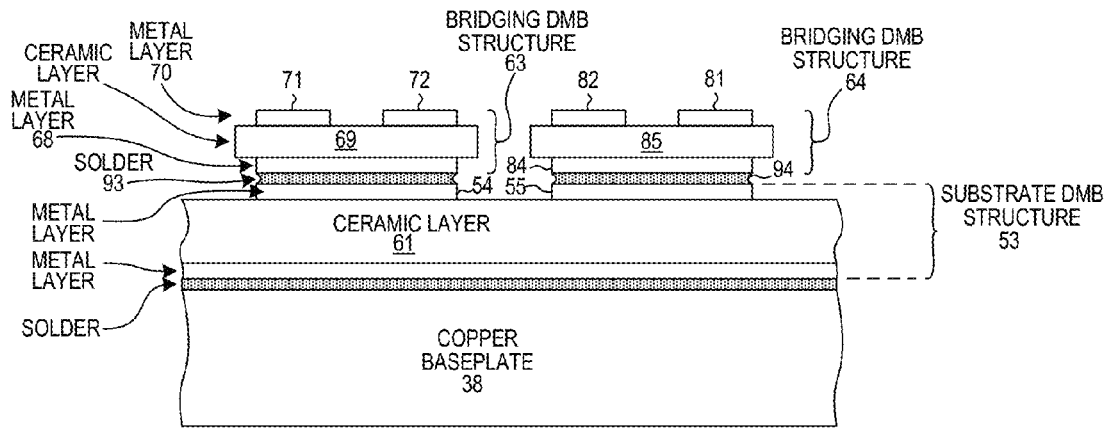
FIG. 13 is an expanded cross-sectional diagram that shows how two novel bridging DMB structures are bonded to the substrate DMB structure within the semiconductor device module of FIG. 1.

FIG. 13 is an expanded cross-sectional diagram that shows how the two bridging DMB structures 63 and 64 are bonded to the substrate DMB structure 53.

Figure 14:
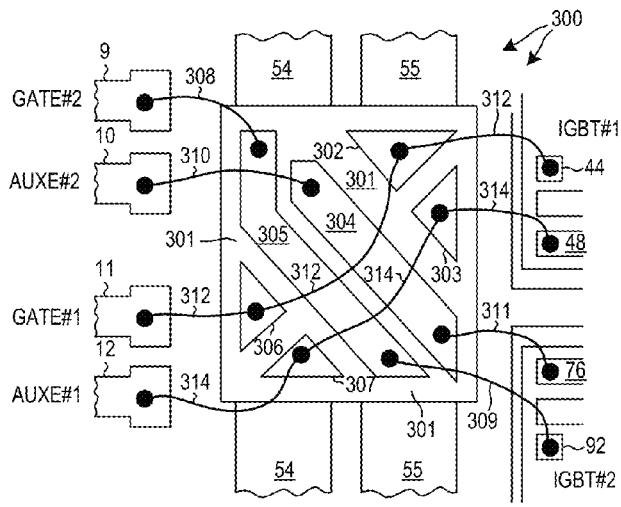
FIG. 14 is a diagram of another bridging DMB structure.
Figure 15:
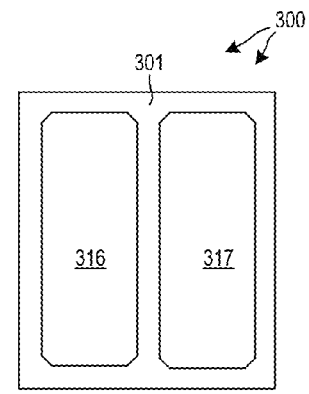
FIG. 15 is a diagram of the bottom of the bridging DMB structure of FIG. 14.

FIG. 14 is a top-down diagram of another embodiment of a bridging DMB structure 300. Reference numeral 301 identifies the square-shaped center ceramic layer. The upper direct bonded metal layer of the DMB structure 300 is patterned into six islands 302-307 having shapes as illustrated in FIG. 14. The bridging DMB structure 300 is shown mounted over and on the two parallel-extending strip-shaped islands 54 and 55 of the underlying substrate DMB structure 53. These strip-shaped islands 54 and 55 are the islands illustrated in FIG. 9. Bonding wires 308 and 309 couple external connection gate terminal 9 to the gate contact 92 of IGBT#2. Bonding wires 310 and 311 couple external connection auxiliary emitter terminal 10 to emitter contact 76 of IGBT#2. Bonding wire 312 couples external connection gate terminal 11 to the gate contact 44 of IGBT#1. Bonding wire 312 makes connection to the DMB structure 300 at two different locations, and bridges up and over islands 305 and 304 without making electrical contact to islands 305 and 304. Bonding wire 314 couples external connection auxiliary emitter terminal 12 to emitter contact 48 of IGBT#1. Like bonding wire 312, bonding wire 314 makes connection to the DMB structure 300 at two different locations, and bridges up and over islands 305 and 304 without making electrical contact to islands 305 and 304. FIG. 15 is a diagram of the bottom DMB structure 300. The bottom direct bonded metal layer of the DMB structure 300 is patterned into two parallel-extending islands 316 and 317. Islands 316 and 317 are of the same width as islands 54 and 55 so that when the DMB structure 300 is placed down onto the substrate DMB structure 53, island 317 makes electrical contact with island 54 but not with island 55, and island 316 makes electrical contact with island 55 but not with island 54. Major and independent current flows can therefore pass in the vertical dimension underneath the DMB structure 300 through the two parallel-extending strip-shaped islands 54 and 55. The gate and auxiliary emitter electrical connection paths being made across the top of the DMB structure 300 are relatively low current paths as compared to the relatively high current flows underneath the DMB structure 300 through strip-shaped islands 54 and 55.

Figure 16:
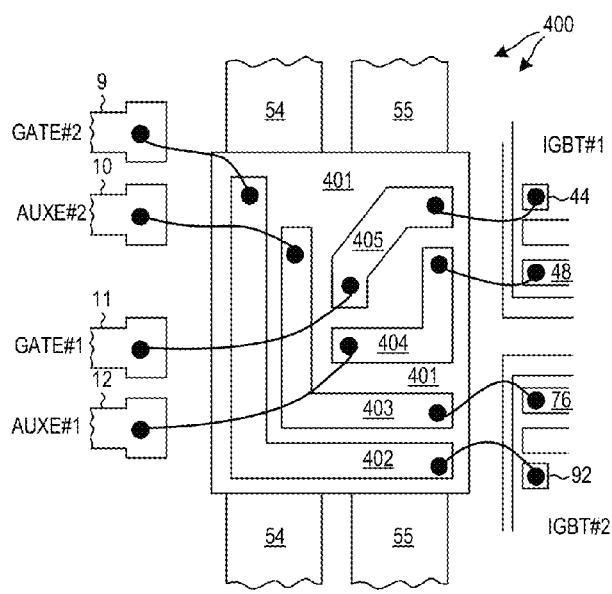
FIG. 16 is a diagram of another bridging DMB structure.

FIG. 16 is a diagram of another embodiment of a bridging DMB structure 400. The bottom of the bridging DMB structure 400 of FIG. 16 is the same as the bottom of bridging DMB structure 300 as illustrated in FIG. 15. Reference numeral 401 identifies the rectangular-shaped center ceramic layer. The upper direct bonded metal layer of the DMB structure 400 is patterned into four islands 402-405 having shapes as illustrated in FIG. 16.

Although certain specific embodiments are described above for instructional purposes, the teachings of this patent document have general applicability and are not limited to the specific embodiments described above. Although bond wires are shown making connections to and through and over bridging DMB structures in the embodiments described above, bond wires need not be used. In some examples, clips are used or bonding ribbon. Although the example of the substrate DMB structure in the novel module set forth above that has a direct bonded metal layer disposed on the bottom side of its ceramic layer, the bottom direct bonded metal layer is optional and in other examples the substrate DMB structure has no such bottom direct bonded metal layer. Although there is no semiconductor device mounted to the top of the two bridging DMB structures described above, in another example an additional gate resistor chip is mounted to the top of a bridging DMB structure. This gate resistor chip is a small rectangular piece of silicon. The gate resistor chip is attached to straddle two lanes on the top of the DMB. One end of the gate resistor chip is coupled to the IGBT gate bonding wire that in turn extends to the gate of the IGBT. Accordingly, various modifications, adaptations, and combinations of various features of the described embodiments can be practiced without departing from the scope of the invention as set forth in the claims.

What is claimed is:

1. A power semiconductor module comprising:
   a metal baseplate;
   a first direct bonded metal (DMB) structure that is disposed on the metal baseplate, wherein the first DMB comprises a ceramic layer, a first direct bonded metal layer disposed on a bottom side of the ceramic layer in thermal contact with the metal baseplate, a first island of a second direct bonded metal layer disposed on a top side of the ceramic layer, and a second island of the second direct bonded metal layer disposed on the top side of the ceramic layer;

a semiconductor device that is disposed on the first island of the second direct bonded metal layer of the first DMB structure;

a second DMB structure that is disposed on the second island of the second direct bonded metal layer of the first DMB structure, wherein the second DMB structure comprises a ceramic layer, a third direct bonded metal layer disposed on a bottom side of the ceramic layer of the second DMB structure, and a fourth direct bonded metal layer disposed on a top side of the ceramic layer of the second DMB structure, wherein the third direct bonded metal layer of the second DMB structure is disposed on the second island of the second direct bonded metal layer of the first DMB structure, and wherein no semiconductor device is disposed on the second DMB structure;

a first external connection terminal;

a second external connection terminal;

a first bonding wire that connects the first external connection terminal to a first bonding location on the fourth direct bonded metal layer of the second DMB structure;

a second bonding wire that connects a second bonding location on the fourth direct bonded metal layer of the second DMB structure to the semiconductor device; and a third bonding wire that extends from the second external connection terminal over the fourth direct bonded metal layer of the second DMB structure without contacting any portion of the fourth direct bonded metal layer of the second DMB structure.

2. The power semiconductor module of claim 1, further comprising:
a second semiconductor device, wherein the third bonding wire electrically couples the second external connection terminal to the second semiconductor device.

3. The power semiconductor module of claim 1, wherein the third bonding wire couples the second external connection terminal to the semiconductor device.

4. The power semiconductor module of claim 1, wherein the fourth direct bonded metal layer of the second DMB structure is an elongated strip of metal.

5. The power semiconductor module of claim 1, wherein the second island of the second direct bonded metal layer of the first DMB structure conducts one of a main emitter current and a collector current, and wherein no part of the fourth direct bonded metal layer of the second DMB structure carries a main emitter current or a collector current.

6. The power semiconductor module of claim 1, wherein the second island of the second direct bonded metal layer of the first DMB structure conducts one of a source current and a drain current, and wherein no part of the fourth direct bonded metal layer of the second DMB structure carries a source current or a drain current.

7. The power semiconductor module of claim 1, wherein the third bonding wire extends over a portion of the fourth direct bonded metal layer that is disposed between the first bonding location and the second bonding location.

8. The power semiconductor module of claim 1, wherein a bonding wire extends from a bonding location on the second DMB structure to another bonding location on the second DMB structure.

9. The power semiconductor module of claim 8, wherein a bridging bonding wire extends from a bonding location on the second DMB structure, and then bridges up and over but does not contact the fourth direct bonded metal layer of the second DMB structure, and then bonds to another bonding location on the second DMB structure.

10. The power semiconductor module of claim 9, wherein the bridging bonding wire further extends from the second DMB structure to a second semiconductor device of the power semiconductor module.

11. The power semiconductor module of claim 9, wherein the bridging bonding wire further extends from the second DMB structure to a third external connection terminal of the power semiconductor module.

12. The power semiconductor module of claim 11, wherein the second direct bonded metal layer of the first DMB structure further comprises a third island, wherein the first and third islands of the second direct bonded metal layer of the first DMB structure are electrically isolated from one other.

13. A power semiconductor module comprising:
a metal baseplate;
a first direct bonded metal (DMB) structure that is disposed on the metal baseplate, wherein the first DMB comprises a ceramic layer, a first direct bonded metal layer disposed on a bottom side of the ceramic layer in thermal contact with the metal baseplate, and a second direct bonded metal layer disposed on a top side of the ceramic layer;
a semiconductor device that is disposed on the first DMB structure;
a second DMB structure that is disposed on the first DMB structure, wherein there is no semiconductor device disposed on the second DMB structure, wherein the second DMB structure comprises a ceramic layer, a third direct bonded metal layer disposed on a bottom side of the ceramic layer, and a fourth direct bonded metal layer disposed on a top side of the ceramic layer;
a first bonding wire that is bonded to the second DMB structure at a first location on the second DMB structure; and
a second bonding wire that is bonded to the second DMB structure at a second location on the second DMB structure.

14. The power semiconductor module of claim 13, wherein the fourth direct bonded metal layer of the second DMB structure comprises a first elongated strip island portion and a second elongated strip island portion, and wherein the first and second elongated strip island portions extend parallel to one another.

15. The power semiconductor module of claim 13, wherein the third direct bonded metal layer of the second DMB structure comprises a first island portion and a second island portion.

16. The power semiconductor module of claim 13, further comprising:
a third bonding wire that extends over the second DMB structure between the first and second locations on the second DMB structure, and wherein the third bonding wire does not contact any portion of the second DMB structure.

17. The power semiconductor module of claim 13, further comprising:

a third bonding wire that is bonded to a first island portion of the fourth direct metal bonded metal layer of the second DMB structure, that bridges over a second island portion of the fourth direct metal bonded metal layer of the second DMB structure, and that is bonded to a third island portion of the fourth direct metal bonded metal layer of the second DMB structure.

18. The power semiconductor module of claim 13, wherein the discrete semiconductor device has a major top surface area, and wherein the second DMB structure has a major top surface area, wherein the major top surface area of the discrete semiconductor device is larger than the major top surface area of the second DMB structure.

19. A power semiconductor module comprising:
a substrate Direct Metal Bonded (DMB) structure that comprises a ceramic layer and a direct bonded metal layer disposed on a top side of the ceramic layer;
a power semiconductor device disposed on the substrate DMB structure, wherein the power semiconductor device die has a major top surface area;
a bridging DMB structure that is disposed on the substrate DMB structure, wherein there is no semiconductor device disposed on the bridging DMB structure, wherein the bridging DMB structure comprises a ceramic layer, a direct bonded metal layer that is bonded to a bottom side of the ceramic layer of the bridging DMB structure, and a direct bonded metal layer that is bonded to a top side of the ceramic layer of the bridging DMB structure, wherein the bridging DMB structure has a major top surface area, and wherein the major top surface area of the power semiconductor device die is larger than the major top surface area of the bridging DMB structure;
a first bond wire or ribbon that is bonded to the bridging DMB structure at a first location on the second DMB structure, wherein the first bond wire or ribbon is not directly bonded to the substrate DMB structure; and
a second bond wire or ribbon that is bonded to the bridging DMB structure at a second location on the bridging DMB structure, wherein the second bond wire or ribbon is not directly bonded to the substrate DMB structure.

20. The power semiconductor module of claim 19, wherein the second bond wire or ribbon extends from the second location on the bridging DMB structure to the power semiconductor device.

* * * * *